(12) United States Patent
Hsu et al.

(10) Patent No.: US 10,340,199 B2
(45) Date of Patent: Jul. 2, 2019

(54) PACKAGING SUBSTRATE WITH BLOCK-TYPE VIA AND SEMICONDUCTOR PACKAGES HAVING THE SAME

(71) Applicant: MEDIATEK INC., Hsin-Chu (TW)

(72) Inventors: Wen-Sung Hsu, Hsinchu County (TW); Tai-Yu Chen, Taipei (TW)

(73) Assignee: MediaTek Inc., Hsin-Chu (TW)

( * ) Notice: Subject to any disclaimer, the term of this patent is extended or adjusted under 35 U.S.C. 154(b) by 172 days.

(21) Appl. No.: 14/925,982

(22) Filed: Oct. 29, 2015

(65) Prior Publication Data

US 2016/0148854 A1 May 26, 2016

Related U.S. Application Data

(60) Provisional application No. 62/082,569, filed on Nov. 20, 2014.

(51) Int. Cl.
*H01L 23/24* (2006.01)
*H01L 23/34* (2006.01)
(Continued)

(52) U.S. Cl.
CPC .......... *H01L 23/34* (2013.01); *H01L 23/3114* (2013.01); *H01L 23/3677* (2013.01); *H01L 23/49811* (2013.01); *H01L 23/49827* (2013.01); *H01L 23/49838* (2013.01); *H01L 23/50* (2013.01); *H01L 25/03* (2013.01); *H01L 25/105* (2013.01); *H01L 24/13* (2013.01); *H01L 24/16* (2013.01); *H01L 24/19* (2013.01); *H01L 24/20* (2013.01); *H01L 24/32* (2013.01); *H01L 24/73* (2013.01); *H01L 2224/0401* (2013.01);
(Continued)

(58) Field of Classification Search
CPC .............. H01L 23/34; H01L 23/49811; H01L 23/49827
See application file for complete search history.

(56) References Cited

U.S. PATENT DOCUMENTS 6,384,476 B2 * 5/2002 Takeuchi .............. H01L 23/642
257/691
6,828,666 B1 12/2004 Herrell
(Continued)

FOREIGN PATENT DOCUMENTS

| TW | 571410 | 1/2004 |
|----|--------|--------|
| TW | 200941658 | 10/2009 |
| TW | 201220453 A1 | 5/2012 |

*Primary Examiner* — Thao X Le
*Assistant Examiner* — Laura M Dykes
(74) *Attorney, Agent, or Firm* — Wolf, Greenfield & Sacks, P.C.

(57) ABSTRACT

A packaging substrate includes a core layer having a first surface and a second surface. A group of ground pads is disposed on the second surface within a central region. A group of first power pads is disposed on the second surface within the central region. A plurality of signal pads is disposed on the second surface within a peripheral region that encircles the central region on the second surface. A first block-type via is embedded in the core layer within the central region. The group of ground pads is electrically connected to the first block-type via. A second block-type via is embedded in the core layer within the central region. The group of first power pads is electrically connected to the second block-type via.

20 Claims, 4 Drawing Sheets

(51) Int. Cl.
*H01L 23/367* (2006.01)
*H01L 23/498* (2006.01)
*H01L 23/50* (2006.01)
*H01L 25/03* (2006.01)
*H01L 25/10* (2006.01)
*H01L 23/31* (2006.01)
*H01L 23/00* (2006.01)

(52) U.S. Cl.
CPC ............ *H01L 2224/04105* (2013.01); *H01L 2224/12105* (2013.01); *H01L 2224/131* (2013.01); *H01L 2224/13147* (2013.01); *H01L 2224/16227* (2013.01); *H01L 2224/32225* (2013.01); *H01L 2224/48091* (2013.01); *H01L 2224/48227* (2013.01); *H01L 2224/73204* (2013.01); *H01L 2225/1023* (2013.01); *H01L 2225/1058* (2013.01); *H01L 2225/1094* (2013.01); *H01L 2924/1436* (2013.01); *H01L 2924/15311* (2013.01); *H01L 2924/15331* (2013.01)

(56) References Cited

U.S. PATENT DOCUMENTS

| | | |
|---|---|---|
| 2003/0201528 A1* | 10/2003 | Hsu .................. H01L 23/50 |
| | | 257/691 |
| 2004/0120128 A1 | 6/2004 | Chang |
| 2006/0208348 A1* | 9/2006 | Ohsaka ............... H01L 24/97 |
| | | 257/685 |
| 2006/0273458 A1 | 12/2006 | Huang |
| 2008/0308925 A1 | 12/2008 | Shen |
| 2009/0236749 A1* | 9/2009 | Otremba .............. H01L 23/36 |
| | | 257/774 |
| 2014/0077388 A1 | 3/2014 | Heo |
| 2014/0319662 A1* | 10/2014 | You .................. H01L 23/481 |
| | | 257/665 |
| 2015/0042415 A1 | 2/2015 | Hurwitz |
| 2015/0228416 A1 | 8/2015 | Hurwitz |
| 2016/0133542 A1* | 5/2016 | Cha ................. H01L 23/3677 |
| | | 257/691 |

* cited by examiner

PACKAGING SUBSTRATE WITH BLOCK-TYPE VIA AND SEMICONDUCTOR PACKAGES HAVING THE SAME

CROSS REFERENCE TO RELATED APPLICATIONS

This application claims the benefit of U.S. provisional application No. 62/082,569 filed Nov. 20, 2014.

BACKGROUND

The present invention relates to a packaging substrate that exhibits increased heat transfer from an integrated circuit chip or chip package during operation.

The mobile phone market has been driving the development of the advanced semiconductor packaging industry. This is primarily due to the desire of manufacturers to accommodate the end user's demand for functionality, performance and miniaturized form factors.

The mobile phone market's influence was first seen through the demand and subsequent adoption of chip scale packaging (CSP), followed closely by multi-chip packaging and package-on-package (PoP) structures for manufacturing. This trend is most notable in the smart phone segment, where applications, baseband and multimedia processors are increasingly adopting flip chip packaging to satisfy size, performance, and, in some cases, cost requirements.

PoP implemented with flip chip package assembly may effectively solve signal integrity and power integrity. However, thermal problem caused by greater power consumption has become a main challenge in this technical field. As known in the art, during operation of an integrated circuit (IC), an IC chip generates heat, thus heating the entire electronics package that contains the chip. Because the performance of the IC chip degrades as its temperature increases, and because high thermal stresses degrade the structural integrity of the electronics package, this heat must be dissipated.

Some flip chip CSP (FCCSP) packages use a metal lid for this required heat dissipation. The heat from the chip is transferred to the metal lid via a thermally conductive chip/lid interface. The heat is then transferred from the lid to the ambient atmosphere via convection. However, such FCCSP structure requires an extra metal lid and is therefore expensive.

SUMMARY

It is one object of the invention to provide an improved packaging substrate that is capable of alleviating the thermal constraints on the advanced semiconductor packages to thereby enhancing the performance.

It is another object of the invention to provide an improved packaging substrate that is capable of alleviating the thermal constraints on the advanced semiconductor packages without the need of employing expensive heat sink or metal lid solution.

To address these and other objects and in view of its purposes, the present invention provides a packaging substrate, comprising a core layer having a first surface and a second surface being opposite to the first surface, a group of ground pads disposed on the second surface within a central region, a group of first power pads disposed on the second surface within the central region, a plurality of signal pads disposed on the second surface within a peripheral region that encircles the central region on the second surface, a first block-type via embedded in the core layer within the central region. The group of ground pads is electrically connected to the first block-type via. A second block-type via is embedded in the core layer within the central region. The group of first power pads is electrically connected to the second block-type via.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
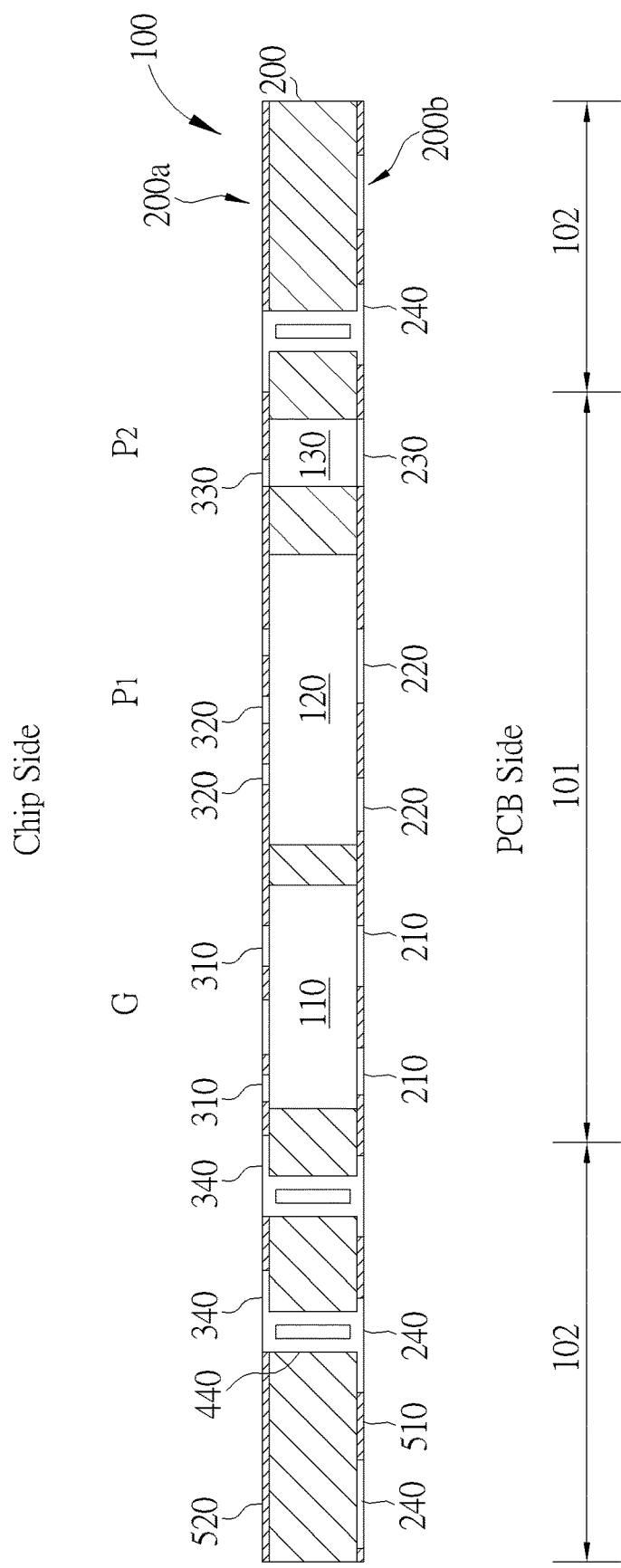
FIG. 1 is a schematic, cross-sectional diagram showing an exemplary packaging substrate according to one embodiment of the invention.

It is to be understood that the following disclosure provides many different embodiments, or examples, for implementing different features of various embodiments. Specific examples of components and arrangements are described below to simplify the present disclosure. These are merely examples and are not intended to be limiting.

In addition, the present disclosure may repeat reference numerals and/or letters in the various examples. This repetition is for the purpose of simplicity and clarity and does not in itself indicate a relationship between the various embodiments and/or configurations discussed.

Moreover, the formation of a first feature over or on a second feature in the description that follows may include embodiments in which the first and second features are formed in direct contact or not in direct contact.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Please refer to FIG. 1. FIG. 1 is a schematic, cross-sectional diagram showing an exemplary packaging substrate 100 according to one embodiment of the invention. Although a 2-layer packaging substrate is illustrated in this embodiment, it is understood that the packaging substrate may have multiple metal wiring layers, for example, four layers or six layers in other embodiments.

As shown in FIG. 1, the packaging substrate 100 comprises a core layer 200 having a first surface 200a and a second surface 200b that is opposite to the first surface 200a. On the first surface 200a, a solder mask layer 520 and a plurality of conductive pads 310, 320, 330, and 340 are provided. These conductive pads 310, 320, 330, and 340 are provided for the electrical connection to an integrated circuit chip or die (not shown in this figure). Therefore, the first surface 200a may be referred to as a "chip side" or "die side" of the packaging substrate 100. It is understood that the conductive pads 310, 320, 330, and 340 are all part of a layer of circuit pattern formed in the solder mask layer 520 on the first surface 200a.

According to the embodiment, the conductive pads 310, 320, and 330 are disposed within a central region 101 and the conductive pads 340 are disposed within a peripheral region 102 that encircles the central region 101. According to the embodiment, the conductive pads 310 may be ground pads that are configured to convey a ground signal (G). According to the embodiment, the conductive pads 320 may be power pads that are configured to convey a power signal in a first power domain ($P_1$). According to the embodiment, the conductive pads 330 may be power pads that are configured to convey a power signal in a second power domain ($P_2$). According to the embodiment, the conductive pads 340 may be signal pads that are configured to convey input/output (I/O) signals.

On the second surface 200b, likewise, a solder mask layer 510 and a plurality of conductive pads 210, 220, 230, and 240 are provided. These conductive pads 210, 220, 230, and 240 are provided for the electrical connection to a printed circuit board (PCB) or motherboard (not shown in this figure). Therefore, the second surface 200b may be referred to as a "PCB side" of the packaging substrate 100. It is understood that the conductive pads 210, 220, 230, and 240 are all part of a layer of circuit pattern formed in the solder mask layer 510 on the second surface 200b.

According to the embodiment, the conductive pads 210, 220, and 230 are disposed within the central region 101 and the conductive pads 240 are disposed within the peripheral region 102 that encircles the central region 101. According to the embodiment, the conductive pads 210 may be ground pads that are configured to convey the ground signal (G). According to the embodiment, the conductive pads 220 may be power pads that are configured to convey a power signal such as $V_{CC}$ in a first power domain ($P_1$). According to the embodiment, the conductive pads 230 may be power pads that are configured to convey a power signal such as $V_{DD}$ in a second power domain ($P_2$). According to the embodiment, the conductive pads 240 may be signal pads that are configured to convey input/output (I/O) signals.

According to the embodiment, the core layer 200 may comprise prepreg or fiberglass-epoxy resin, but it is not limited thereto. The conductive pads 310~340, and 210~240 may include conductive materials such as copper, and in some cases, a surface finish layer or a protective layer. The solder mask layer 510 and 520 may comprise any suitable solder resistive resins.

Within the peripheral region 102, the corresponding conductive pads 240 and 340 may be electrically interconnected together by a conductive via or a plated through hole (PTH) 440 that penetrates through the entire thickness of the core layer 200. The conductive via 440 may be formed by laser drilling, mechanical drilling or lithography process, etc.

According to the embodiment, a plurality of conductive pads 210 are configured in a group on the second surface 200b and a plurality of conductive pads 310 are configured in a group on the first surface 200a. The group of conductive pads 210 and the group of conductive pads 310 may be electrically interconnected together through a single block-type via 110 embedded in the core layer 200. The block-type via 110 penetrates through the entire thickness of the core layer 200.

According to the embodiment, a plurality of conductive pads 220 are configured in a group and a plurality of conductive pads 320 are configured in a group. The group of conductive pads 220 and the group of conductive pads 320 may be electrically interconnected together through a single block-type via 120 embedded in the core layer 200.

According to the embodiment, a plurality of conductive pads 230 are configured in a group and a plurality of conductive pads 330 are configured in a group. The group of conductive pads 230 and the group of conductive pads 330 may be electrically interconnected together through a single block-type via 130 embedded in the core layer 200.

According to the embodiment, each of the block-type vias 110, 120, and 130 may be made of a monolithic metal such as copper or other suitable heat-dissipating materials. According to the embodiment, the width of each of block-type vias 110, 120, and 130 may be 100 times of the diameter of the conductive via 440, for example. Therefore, both thermal and power integrity performance can be significantly improved.

Figure 2:
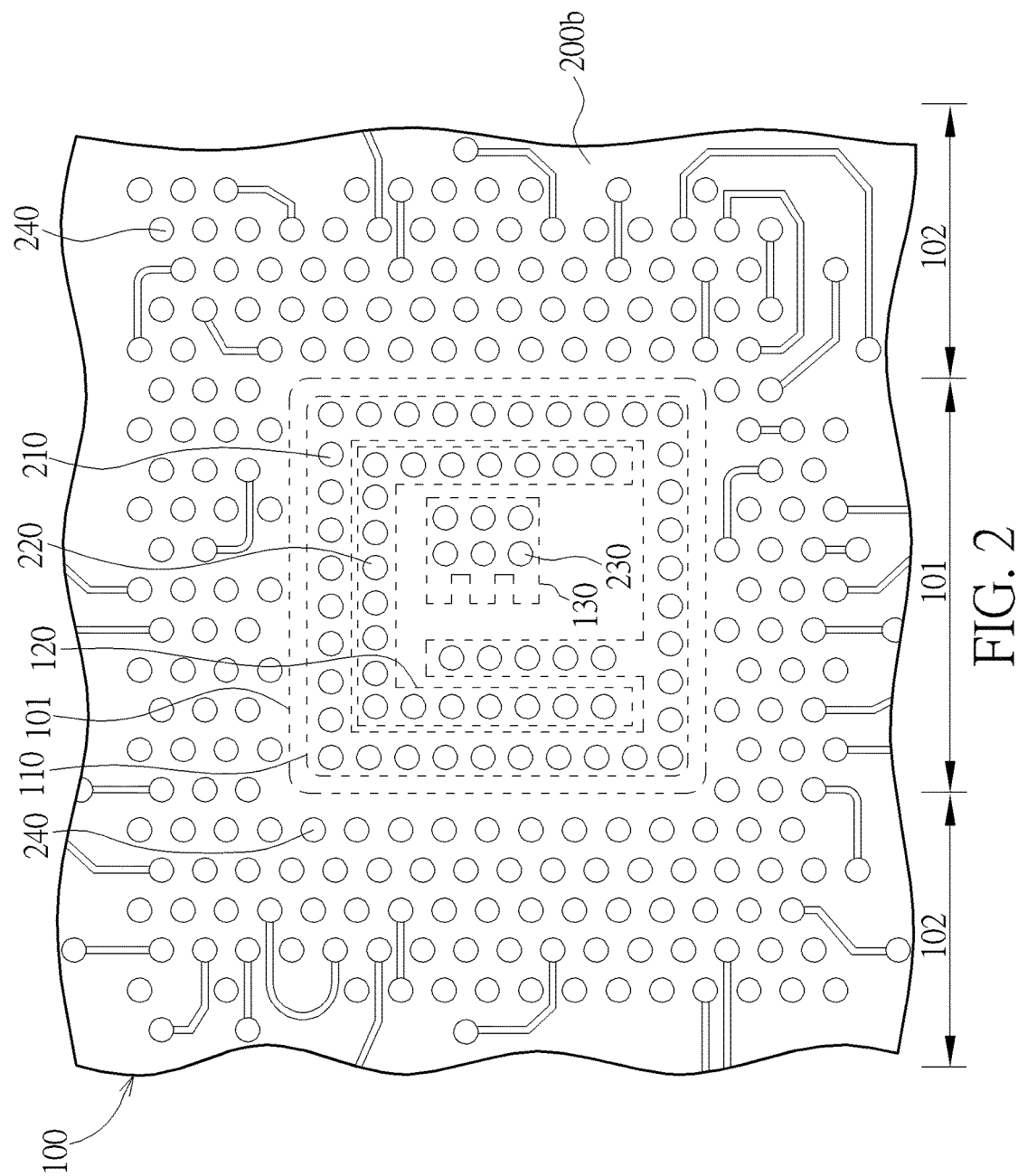
FIG. 2 is a perspective, plan view showing an exemplary layout or footprint of the conductive pads and block-type via on the PCB side of the packaging substrate.

FIG. 2 is a perspective, plan view showing an exemplary layout or footprint of the conductive pads and block-type via on the PCB side of the packaging substrate, wherein like element, regions or layers are designated with like numeral numbers. It is to be understood that the layout or footprint of the conductive pads and block-type via on the PCB side of the packaging substrate depicted in FIG. 2 is for illustration purpose only. Other layout or footprint may be applied in other embodiments.

As shown in FIG. 2, the block-type vias 110, 120, and 130 are indicated with dotted lines within the central region 101. According to the embodiment, the block-type via 110 may surround the block-type vias 120, and 130. As can be seen in FIG. 2, a group of conductive pads 210 for conveying ground signal is electrically connected to a single block-type via 110, a group of conductive pads 220 for conveying power signal in a first power domain ($P_1$) is electrically connected to a single block-type via 120, and a group of conductive pads 230 for conveying power signal in a second power domain ($P_2$) is electrically connected to a single block-type via 130.

Figure 3:
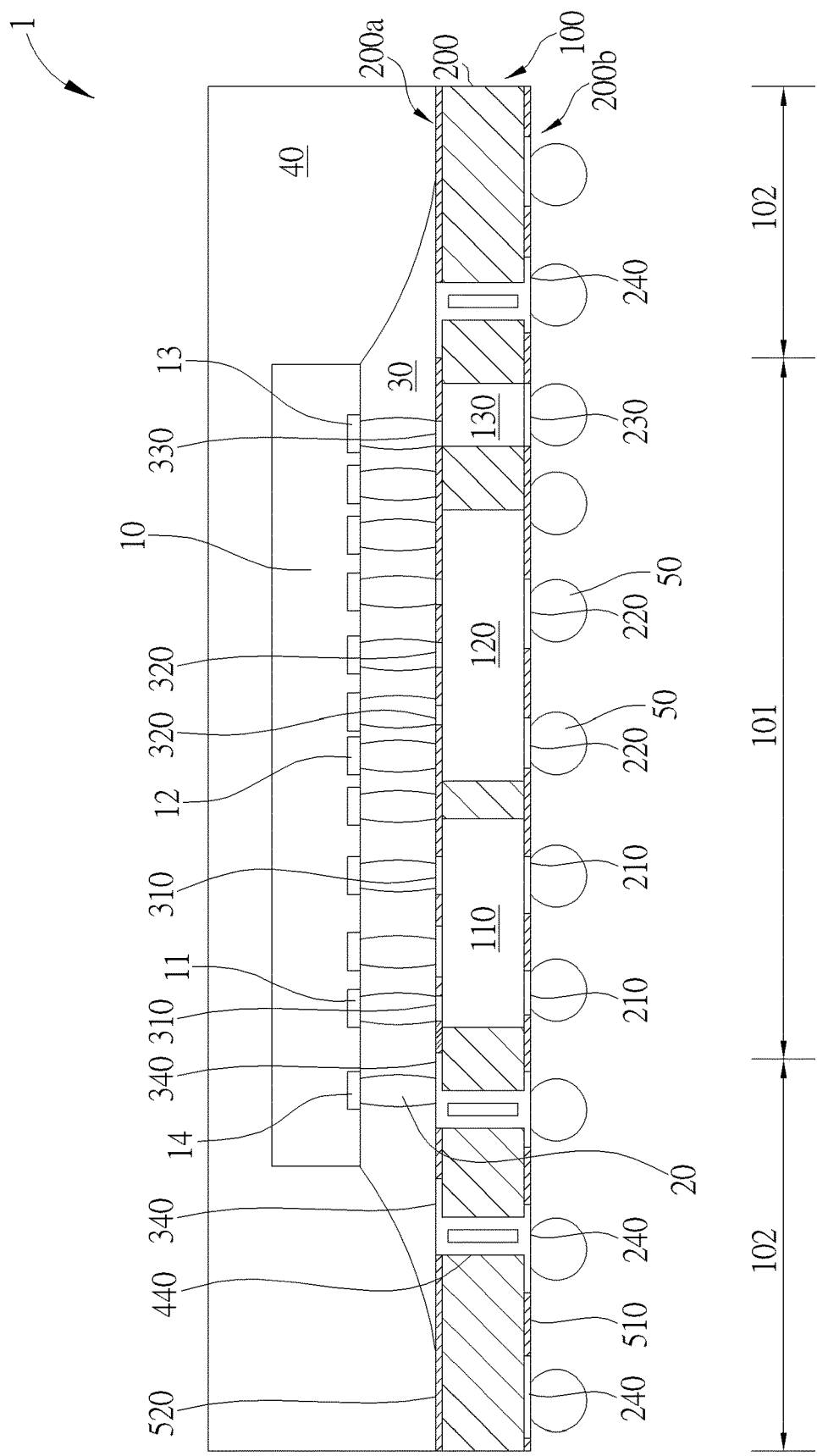
FIG. 3 is a schematic, cross-sectional diagram showing an exemplary flip chip chip-scale package (FCCSP) in accordance with another embodiment of the invention.

FIG. 3 is a schematic, cross-sectional diagram showing an exemplary flip chip chip-scale package (FCCSP) in accordance with another embodiment of the invention. As shown in FIG. 3, the flip chip chip-scale package 1 comprises a packaging substrate 100 as described above and a flipped semiconductor die 10 assembled face-down to the chip side of the packaging substrate 100. For example, the packaging substrate 100 is a 2-layer substrate having only two metal wiring layers on the two opposite sides of the packaging substrate 100 respectively. It is to be understood that in other embodiments the semiconductor die 10 may be replaced with a wafer level package, for example, a fan-out wafer level package, but not limited thereto.

According to the embodiment, the semiconductor die 10 also has a plurality of bonding pads 11, 12, 13 and 14 disposed on its active surface that faces the chip side of the packaging substrate 100. A plurality of conductive elements 20 are provided between the semiconductor die 10 and the packaging substrate 100 to respectively connect the bonding pads 11, 12, 13, and 14 to the conductive pads 310, 320, 330, and 340. According to the embodiment of the invention, the conductive elements 20 may comprise copper pillars or solder bumps, but not limited thereto.

An underfill 30 may be disposed between the semiconductor die 10 and the packaging substrate 100 to surround the conductive elements 20. It is known that the underfill 30 controls the stress in the solder joints caused by the difference in thermal expansion between the semiconductor die 10 and the packaging substrate 100. Once cured, the underfill 30 absorbs the stress, reducing the strain on the solder bumps, greatly increasing the life of the finished package. It is understood that in some cases, the underfill 30 may be omitted or replaced with other materials such as molding compounds. A mold cap 40 may be provided to encapsulate the semiconductor die 10 and some portions of the packaging substrate 100.

As described above, according to the embodiment of the invention, the ground pads within the central region 101 are grouped together to electrically connected to a single block-type via 110, the power pads of the first power domain ($P_1$) within the central region 101 are grouped together to electrically connected to a single block-type via 120, and the power pads of the second power domain ($P_2$) within the central region 101 are grouped together to electrically connected to a single block-type via 130. During operation of the semiconductor die 10, the heat can be efficiently dissipated through the block-type vias 110, 120, and 130. In addition, on the second surface 200b, a plurality of solder balls 50 is provided for further connection. The heat guided from the block-type vias 110, 120, 130 may be transferred via the solder balls 50 to the outside, for example, a circuit board.

Figure 4:
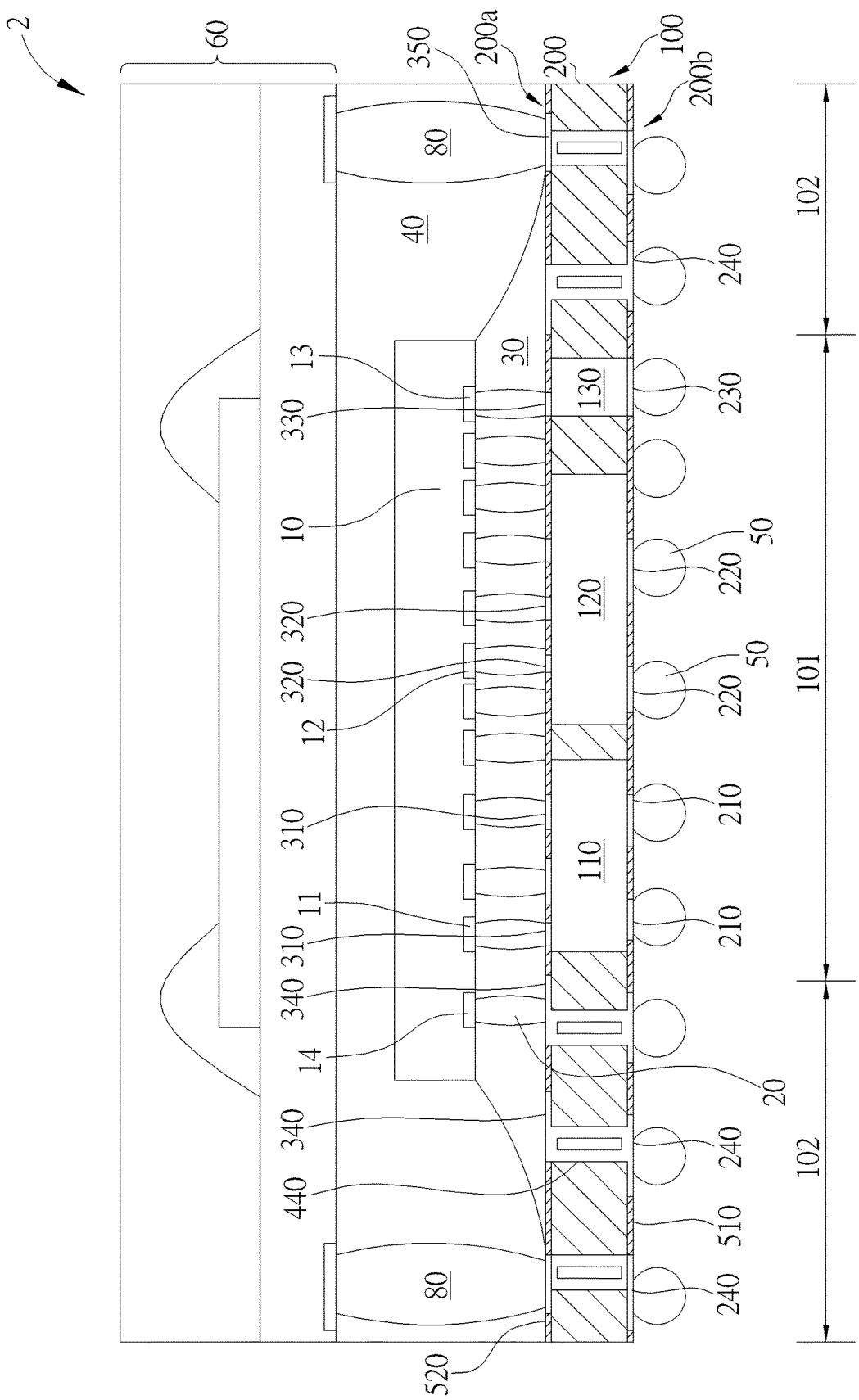
FIG. 4 is a schematic, cross-sectional diagram showing an exemplary package-on-package (PoP) in accordance with still another embodiment of the invention.

FIG. 4 is a schematic, cross-sectional diagram showing an exemplary package-on-package (PoP) in accordance with still another embodiment of the invention. As shown in FIG. 4, the PoP 2 comprises a packaging substrate 100 as described above and a flipped semiconductor die 10 assembled face-down to the chip side of the packaging substrate 100. For example, the packaging substrate 100 is a 2-layer substrate having only two metal wiring layers on the two opposite sides of the packaging substrate 100 respectively. It is to be understood that in other embodiments the semiconductor die 10 may be replaced with a wafer level package, for example, a fan-out wafer level package, but not limited thereto.

A plurality of conductive elements 20 are provided between the semiconductor die 10 and the packaging substrate 100 to respectively connect the bonding pads 11, 12, 13, and 14 to the conductive pads 310, 320, 330, and 340. According to the embodiment of the invention, the conductive elements 20 may comprise copper pillars or solder bumps, but not limited thereto. An underfill 30 may be disposed between the semiconductor die 10 and the packaging substrate 100 to surround the conductive elements 20. It is understood that in some cases, the underfill 30 may be omitted or replaced with other materials such as molding compounds.

As described above, according to the embodiment of the invention, the ground pads within the central region 101 are grouped together to electrically connected to a single block-type via 110, the power pads of the first power domain ($P_1$) within the central region 101 are grouped together to electrically connected to a single block-type via 120, and the power pads of the second power domain ($P_2$) within the central region 101 are grouped together to electrically connected to a single block-type via 130.

A chip package 60 is assembled on the chip side of the packaging substrate 100 and is electrically connected to the corresponding pads 350 on the packaging substrate 100 through the conductive elements 80 such as solder bumps or copper pillars. For example, the chip package 60 may be a DRAM (dynamic random access memory) chip package, but not limited thereto. In addition, on the second surface 200b, a plurality of solder balls 50 is provided for further connection. The heat guided from the block-type vias 110, 120, 130 may be dissipated efficiently via the solder balls 50 to the outside, for example, a circuit board.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A packaging substrate, comprising:
a layer of a core layer material, having a first surface and a second surface being opposite to the first surface;
a central region on the second surface;
a peripheral region encircling the central region;
a group of ground pads disposed on the second surface within the central region;
a group of first power pads disposed on the second surface within the central region;
a group of second power pads disposed on the second surface within the central region;
a plurality of signal pads disposed on the second surface within the peripheral region;
a single first block-type via embedded in the layer within the central region, wherein the group of ground pads is physically in contact with the single first block-type via;
a single second block-type via embedded in the layer within the central region, wherein the group of first power pads is physically in contact with the single second block-type via, and the single first block-type via completely surrounds the single second block-type via; and
a third block-type via embedded in the core layer within the central region, wherein the group of second power pads is electrically connected to the third block-type via,
wherein a first portion of the core layer material separates the single first block-type via and single second block-type via, a second portion of the core layer material is outside the single first block-type via, and the first and second portions of the core layer material have a same dielectric constant, and
wherein the single first block-type via has a finger separating the single second block-type via and third block-type via.

2. The packaging substrate according to claim 1, wherein the single first block-type via and the single second block-type via are made of monolithic metal that penetrates through an entire thickness of the layer of the core layer material.

3. The packaging substrate according to claim 1, wherein the core layer material comprises prepreg or fiberglass-epoxy resin.

4. The packaging substrate according to claim 1, wherein the group of ground pads communicates with the first surface only through the single first block-type via.

5. The packaging substrate according to claim 1, wherein the group of first power pads communicates with the first surface only through the single second block-type via.

6. The packaging substrate according to claim 1, wherein the group of first power pads is used to convey a power signal in a first power domain, and the group of second power pads is used to convey a power signal in a second power domain that is different from the first power domain.

7. The packaging substrate according to claim 6, wherein the power signal in a first power domain is $V_{CC}$ and the power signal in a second power domain is $V_{DD}$.

8. The packaging substrate according to claim 1, wherein the ground pads and the first power pads are copper pads.

9. The packaging substrate according to claim 1, wherein the single first block-type via and the single second block-type via comprise copper.

10. The packaging substrate according to claim 1, wherein the signal pads within the peripheral region communicate with the first surface through plated through holes respectively.

11. A flip chip chip-scale package, comprising:
a packaging substrate according to claim 1; and
a flipped chip facedown assembled on the first surface of the packaging substrate, wherein the group of ground pads communicates with the first surface only through the single first block-type via.

12. A flip chip chip-scale package, comprising:
a packaging substrate according to claim 1; and
a flipped chip facedown assembled on the first surface of the packaging substrate, wherein the group of first power pads communicates with the first surface only through the single second block-type via.

13. A package-on-package, comprising:
a packaging substrate according to claim 1;
a flipped chip facedown assembled on the first surface of the packaging substrate; and
a chip package assembled on the first surface of the packaging substrate.

14. The package-on-package according to claim 13, wherein the chip package comprises a DRAM chip package.

15. The package-on-package according to claim 13, wherein the group of ground pads communicates with the first surface only through the single first block-type via.

16. The package-on-package according to claim 13, wherein the group of first power pads communicates with the first surface only through the single second block-type via.

17. The package-on-package according to claim 13 further comprising:
a group of second power pads disposed on the second surface within the central region; and
a third block-type via embedded in the layer of the core layer material within the central region, wherein the group of second power pads is electrically connected to the third block-type via.

18. The package-on-package according to claim 17, wherein the group of first power pads is used to convey a power signal in a first power domain, and the group of second power pads is used to convey a power signal in a second power domain that is different from the first power domain.

19. A packaging substrate, comprising:
a core layer having a first surface and a second surface being opposite to the first surface;
a central region on the second surface;
a peripheral region encircling the central region;
a group of ground pads disposed on the second surface within the central region;
a group of first power pads disposed on the second surface within the central region;
a group of second power pads disposed on the second surface within the central region;
a plurality of signal pads disposed on the second surface within the peripheral region;
a single first block-type via embedded in the core layer within the central region, wherein the group of ground pads is physically in contact with the single first block-type via;
a single second block-type via embedded in the core layer within the central region, wherein the group of first power pads is physically in contact with the single second block-type via; and
a single third block-type via embedded in the core layer within the central region, wherein the group of second power pads is physically in contact with the single third block-type via;
wherein the single first block-type via is all around the single second block-type via and single third block-type via, and the single first block-type via has a finger separating the single second block-type via and single third block-type via.

20. The packaging substrate according to claim 19, wherein the group of first power pads is used to convey a power signal in a first power domain, and the group of second power pads is used to convey a power signal in a second power domain that is different from the first power domain.

* * * * *